United States Patent
Lee et al.

(10) Patent No.: US 10,657,352 B2
(45) Date of Patent: May 19, 2020

(54) FLAT PANEL DISPLAY EMBEDDING OPTICAL IMAGING SENSOR

(71) Applicant: LG Display Co., Ltd., Seoul (KR)

(72) Inventors: Guensik Lee, Seoul (KR); Seungman Ryu, Paju-si (KR); ARa Yoon, Seoul (KR); Junghoon Lee, Incheon (KR)

(73) Assignee: LG Display Co., Ltd., Seoul (KR)

( * ) Notice: Subject to any disclaimer, the term of this patent is extended or adjusted under 35 U.S.C. 154(b) by 194 days.

(21) Appl. No.: 15/834,959

(22) Filed: Dec. 7, 2017

(65) Prior Publication Data

US 2018/0165497 A1     Jun. 14, 2018

(30) Foreign Application Priority Data

Dec. 8, 2016   (KR) .................. 10-2016-0167097
May 2, 2017    (KR) .................. 10-2017-0056318

(51) Int. Cl.
*G06K 9/00*      (2006.01)
*H01L 27/32*     (2006.01)
(Continued)

(52) U.S. Cl.
CPC ......... *G06K 9/0004* (2013.01); *G02B 6/0035* (2013.01); *G06F 3/0412* (2013.01);
(Continued)

(58) Field of Classification Search
CPC ............. G06K 9/0004; G06K 9/00013; G06K 9/0008; G02B 6/0035; G02B 5/32;
(Continued)

(56) References Cited

U.S. PATENT DOCUMENTS

| | | |
|---|---|---|
| 9,557,458 B2 * | 1/2017 | Lutolf ................. G02B 5/1852 |
| 2004/0062502 A1 | 4/2004 | Levola |
| 2015/0185393 A1 | 7/2015 | Bang et al. |

FOREIGN PATENT DOCUMENTS

| | | |
|---|---|---|
| CN | 105 184 282 A | 12/2015 |
| EP | 3 196 802 A1 | 7/2017 |

OTHER PUBLICATIONS

Extended European Search Report, dated Apr. 26, 2018 for the European patent application No. 17205816.6.

* cited by examiner

*Primary Examiner* — Collin X Beatty
(74) *Attorney, Agent, or Firm* — Polsinelli PC (57) ABSTRACT

The present disclosure relates to a flat panel display embedding an optical imaging sensor such as a fingerprint image sensor. The present disclosure provides a flat panel display embedding an image sensor comprising: a display panel including a display area and a non-display area; and a directional optical unit having a length and a width corresponding to the display panel and a thickness, and attached on a top surface of the display panel, wherein the directional optical unit includes: a first cover plate and a second cover plate having a size corresponding to the length and the width and joining each other by a first low refractive layer between the first cover plate and the second cover plate; a light radiating film corresponding to the display area under the second cover plate; a light incident film disposed outside of the display area at one lateral side of the light radiating film, under the second cover plate; a second low refractive layer disposed under the light radiating film and the light incident film, and attached on the top surface of the display panel; and a light source disposed at the lateral side of the display panel as facing with the light incident film.

10 Claims, 6 Drawing Sheets

(51) Int. Cl.
  *G06F 3/042* (2006.01)
  *G06F 3/041* (2006.01)
  *G02F 1/1333* (2006.01)
  *G06F 1/16* (2006.01)
  *G02B 5/32* (2006.01)
  *H04M 1/02* (2006.01)
  *F21V 8/00* (2006.01)

(52) U.S. Cl.
  CPC .......... *G06F 3/0416* (2013.01); *G06F 3/0421* (2013.01); *G06K 9/0008* (2013.01); *G06K 9/00013* (2013.01); *H01L 27/323* (2013.01); *H04M 1/0266* (2013.01); *G02B 5/32* (2013.01); *G02F 1/13338* (2013.01); *G06F 1/1637* (2013.01)

(58) Field of Classification Search
  CPC .... G06F 3/0421; G06F 3/0416; G06F 3/0412; G06F 1/13338; G06F 1/1637
  USPC .......................................................... 359/34
  See application file for complete search history.

$T_{CP1\_AIR} < \alpha < T_{CP2\_LR1} \approx T_{VHOE\_LR2} < \theta$ ex) $45° < \alpha < 55°$
$70° < \theta < 75°$

$\theta = 72°$
$T_2 = 0.10mm (or\ 0.15mm)$
$\ell_2 = 0.31mm$
$W_{LO} \leq 0.62mm$

FLAT PANEL DISPLAY EMBEDDING OPTICAL IMAGING SENSOR

CROSS-REFERENCE TO RELATED APPLICATIONS

This application claims the benefit of Korea Patent Application No. 10-2016-0167097 filed on Dec. 8, 2016, and No. 10-2017-0056318 filed on May 2, 2017, which are incorporated herein by reference in their entirety for all purposes as if fully set forth herein.

BACKGROUND

Field of the Disclosure

The present disclosure relates to a display device, and more particularly, to a flat panel display embedding an optical imaging sensor including an ultra-thin substrate providing directional lights and an optical imaging sensor.

Description of the Background

Various computer based systems including notebook computers, tablet personal computers (or, PC), smart phones, personal digital assistants, automated teller machines (ATM) and/or search information system have been developed. As these devices use and store various personal information as well as business information and confidential information, it is required to strengthen the securities for preventing these important data being leaked.

To do so, one method has been suggested for strengthening the security using an image sensor recognizing the authorized user's biological information. For example, the fingerprint sensor is generally used for enhancing the security when registering and authenticating are performed. The fingerprint sensor is for sensing the fingerprint of user. The fingerprint sensor may be categorized into an optical fingerprint sensor and a capacitive fingerprint sensor.

The optical fingerprint sensor uses a light source such as a light emitting diode (or LED) to irradiate lights and detects the lights reflected by the ridge of the fingerprint using a CMOS (or, complementary metal oxide semiconductor) image sensor. As the optical fingerprint sensor may scan the fingerprint using the LED lights, it is required that the sensor is equipped with an additional device for a scanning process. There is a limitation to increasing the size of the object for scanning the image. Therefore, there are limitations to applying the optical fingerprint sensor to various applications such as combining with the display devices.

For conventional optical fingerprint sensors, known are Korean patent 10-060817 registered on Jun. 26, 2006 of which title is "A display apparatus having fingerprint identification sensor" and a Korean patent application 10-2016-0043216 published on Apr. 21, 2016 of which title is "Display device including fingerprinting device".

The above mentioned optical fingerprint sensor uses the display area as the touch area for inputting the user's selection and the sense area for sensing the fingerprint. However, this optical fingerprint sensor uses the diffused (or diverged) lights having very low directivity. Therefore, there is a limitation to recognize the exact fingerprint pattern. When using the collimated lights such as the infrared laser having high directivity, it is very hard to generating the sensing lights as covering the wider area. Therefore, the fingerprint sensing area is restricted in small area. In order to radiate the collimated lights over the wider scan area, specific scanning structure is required, so that this system is not suitable for portable or personal display apparatus.

Therefore, for portable devices embedding the fingerprint sensor, the capacitive fingerprint sensor is mainly used. However, the capacitive fingerprint sensor also has many problems.

The capacitive fingerprint sensor is configured to detect the difference of the electricity between the ridge and the valley of the fingerprint contacting on the fingerprint sensor. For conventional capacitive fingerprint sensors, known is US patent application 2013/0307818 published on Nov. 21, 2013 of which title is "Capacitive Sensor Packaging".

The above mentioned capacitive fingerprint sensor is an assembly type embedding with a specific push button. It has a capacitive plate and a silicon wafer having a circuit for detecting the capacitive storage difference between the ridge and valley of the fingerprint. Generally, as the sizes of the ridge and valley of the fingerprint are very tiny, about 300~500 μm (micrometer), the capacitive fingerprint sensor needs a high resolution sensor array and an integrated chip (or IC) for processing the fingerprint detection. To do so, the silicon wafer includes the sensor array and the IC on one substrate.

However, when the high resolution sensor array and the IC are formed on the same silicon wafer, the assembly structure for joining the push button with the fingerprint sensor is required. Therefore, the structure would be very complex and further the non-display area (or bezel area) may be increased. In some cases, the push button (i.e., the home key of the smart phone) overlaps the fingerprint sensor, so that the thickness of the whole device becomes inevitably thick. Further, the sensing area for the fingerprint is dependent on the size of the push button.

To solve above mentioned problems and limitations, some technologies have been suggested in which the touch sensor area is used as for sensing the fingerprint. For example, known are U.S. Pat. No. 8,564,314 registered on Oct. 22, 2013 of which title is "Capacitive touch sensor for identifying a fingerprint", and Korean patent 10-1432988 registered on Aug. 18, 2014 of which title is "A capacitive touch screen for integrated of fingerprint recognition".

In general, the personal portable devices such as the smart phones, an additional transparent film is attached for protecting the display glass panel. When the above mentioned technologies are applied to the personal portable devices, as attaching the protective film thereon, the performance for sensing or recognizing the fingerprint can be substantially degraded. In general, even though the protective film is attached, the touch function may be properly operated. However, the detection ability for the difference of the capacitive storage amount for sensing the fingerprint may be deteriorated by the protective film even though its thickness is very thin.

For a display embedding the capacitive fingerprint sensor, generally a protective film or a hardening glass may be further attached on the cover glass of the display. In that case, the recognition ability can be deteriorated. That is, the total thickness of the cover glass may affect to the sensitivity of the capacitive fingerprint sensor. In the interim, the diffused lights used in the sensing light source may affect to the sensitivity of the optical fingerprint sensor. When using the collimated lights for enhancing the sensitivity of the optical fingerprint sensor, the bulky and/or complex optical devices are required so that it is difficult to apply to a display for a personal mobile device.

SUMMARY

In order to overcome the above mentioned drawbacks, the purpose of the present disclosure is to provide a flat panel display embedding an ultra-thin optical image sensor (or an optical image recognition apparatus). Another purpose of the present disclosure is to provide a flat panel display having an optical image sensor in which most of all or whole surface of the display panel would be used for the sensing area. Still another purpose of the present disclosure is to provide a flat panel display embedding an optical image sensor in which a directional light is used as a sensing light covering large surface. Yet another purpose of the present disclosure is to provide a flat panel display embedding an ultra-thin and large area optical image sensor of which resolution and sensitivity are very high and/or superior. Still yet another purpose of the present disclosure is to provide a flat panel display embedding an optical image sensor in which any interference between the printing element disposed at non-display area of the cover plate and the image sensing elements.

In order to accomplish the above purpose, the present disclosure provides a flat panel display embedding an image sensor comprising: a display panel including a display area and a non-display area; and a directional optical unit having a length and a width corresponding to the display panel and a thickness, and attached on a top surface of the display panel, wherein the directional optical unit includes: a first cover plate and a second cover plate having a size corresponding to the length and the width and joining each other by a first low refractive layer between the first cover plate and the second cover plate; a light radiating film corresponding to the display area under the second cover plate; a light incident film disposed outside of the display area at one lateral side of the light radiating film, under the second cover plate; a second low refractive layer disposed under the light radiating film and the light incident film, and attached on the top surface of the display panel; and a light source disposed at the lateral side of the display panel as facing with the light incident film.

In one aspect, the light source provides an incident light to an incident point defined on a surface of the light incident film; the light incident film includes a first holographic pattern for converting the incident light to a propagating light having an incident angle satisfying an internal total reflection condition of the second cover plate, and for sending the propagating light into the second cover plate; and the light radiating film includes a second holographic pattern for converting some of the propagating light into the sensing light having a reflection angle which satisfies a total reflection condition at the top surface of the first cover plate and a transmitting condition through the first low refractive layer and the second low refractive layer.

In one aspect, the incident angle is larger than a first internal total reflection critical angle between the light radiating film and the second low refractive layer, and larger than a second internal total reflection critical angle between the second cover plate and the first low refractive layer.

In one aspect, the reflection angle is larger than a first total reflection critical angle between the first cover plate and an air layer, and smaller than a second total reflection critical angle between the light radiating film and the second low refractive layer.

In one aspect, the propagating light has an expanding angle on a horizontal plane including the length axis and the width axis, and maintains the collimated state on a vertical plane including the length axis and the thickness axis.

In one aspect, the expanding angle is at least equal to an inner angle between a first line and a second line, the first line is connecting the incident point and one end of an opposite side of the second cover plate, and the second line is connecting the incident point and other end of the opposite side of the second cover plate.

In one aspect, the flat panel display embedding an image sensor further comprises: a deco layer disposed as least any one of one side and an opposite side corresponding to the non-display area, under the first cover plate.

In one aspect, the light incident film and the light source are disposed under the deco layer.

In one aspect, the first low refractive layer and the deco layer are one of a film, a coating layer and a pattern disposed between the first cover plate and the second cover plate.

In one aspect, a thickness between the deco layer and the light incident film is 1.0 mm at least.

In one aspect, the second cover plate has a thickness of 0.70 mm at least.

The present disclosure suggests a flat panel display embedding an optical image sensor that has a high resolution recognizing ability or sensitivity by providing the directionized lights (or 'oriented') as the sensing lights. Comparing with the diffused lights used in the conventional art for the fingerprint sensor, because that the directionized lights according to the present disclosure are used for sensing the image without any loss of lights so that the present disclosure has the merits of the higher resolution and the superior sensitivity. The present disclosure provides a flat panel display embedding a large area optical image sensor in which a collimated infrared laser beam is expanded over a large area corresponding to the display panel for the sensing lights using a holography technology. The present disclosure provides a flat panel display having an ultra-thin optical image sensor in which a direction light is provided on the display surface within a thin thickness. Further, according to the present disclosure, the protective substrate disposed on the topmost surface is used as the cover substrate of the direction optical substrate. Using a holographic film, the collimated light is provided as covering the large area corresponding to the display surface so that the present disclosure suggests an ultra-thin direction optical substrate. When joining the optical image sensor to the display device, the whole thickness of the display device is not thicker. Especially, joining two cover glasses and guiding the sensing light for recognizing the image of the object inside of the lower cover glass, the light loss can be minimized. Further, the decoration layer can be inserted between two cover glasses, the interferences between the decoration layer and any elements for detecting/recognizing the image would not be occurred.

BRIEF DESCRIPTION OF THE DRAWINGS

The accompanying drawings, which are included to provide a further understanding of the disclosure and are incorporated in and constitute a part of this application, illustrate aspects of the disclosure and together with the description serve to explain the principles of the disclosure.

In the drawings.

DETAILED DESCRIPTION

Referring to attached figures, we will explain various aspects of the present disclosure. Like reference numerals designate like elements throughout the detailed description. However, the present disclosure is not restricted by these aspects but can be applied to various changes or modifications without changing the technical spirit. In the following aspects, the names of the elements are selected by considering the easiness for explanation so that they may be different from actual names.

Figure 1A:
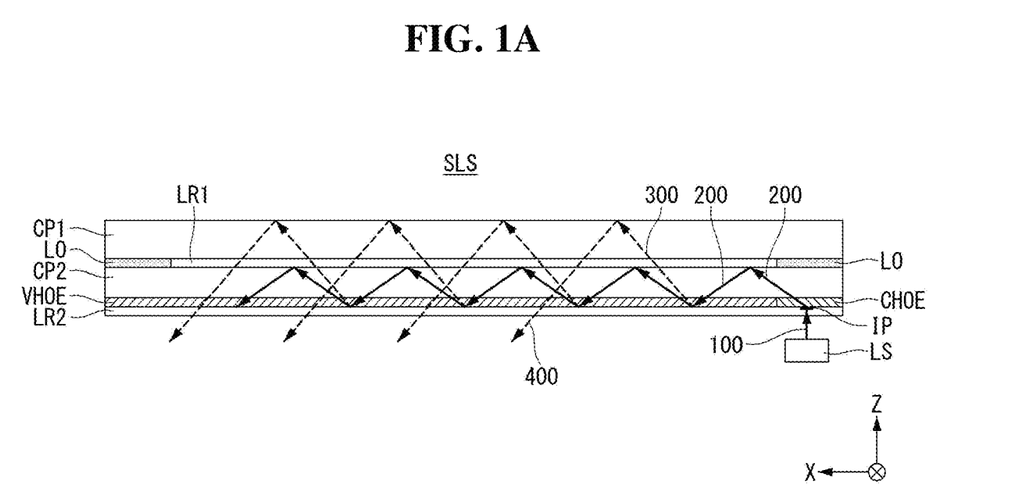
FIGS. 1A and 1B illustrate a structure of a directional optical substrate applied for a flat panel display embedding an optical image sensor according to an aspect of the present disclosure.
Figure 1B:
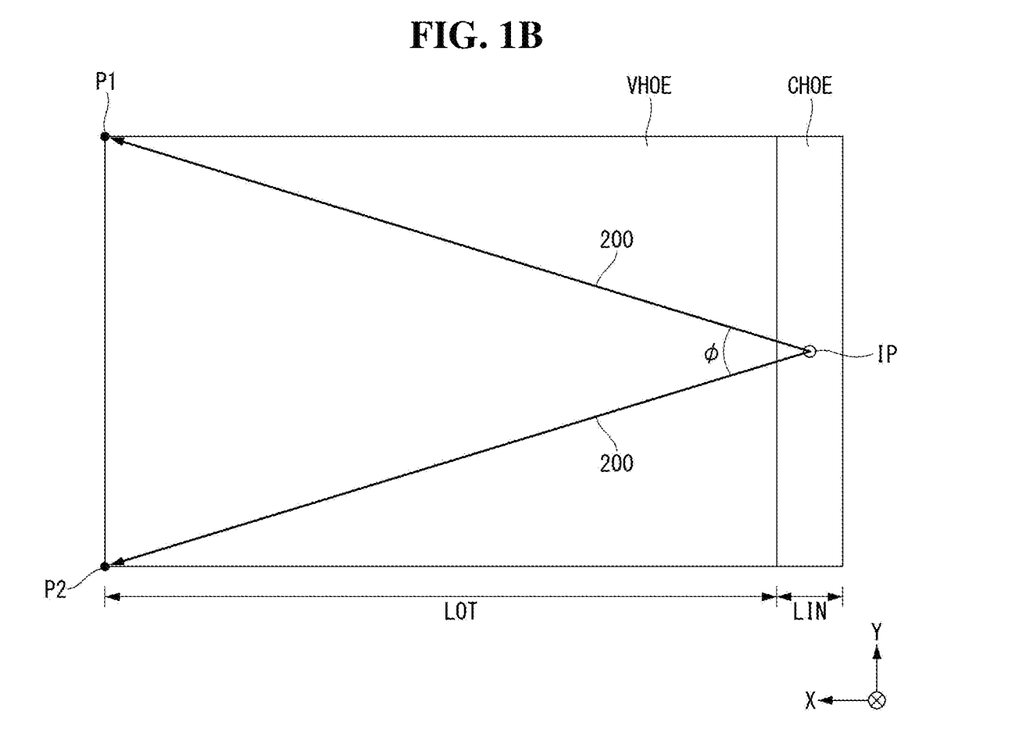
Figure 2:
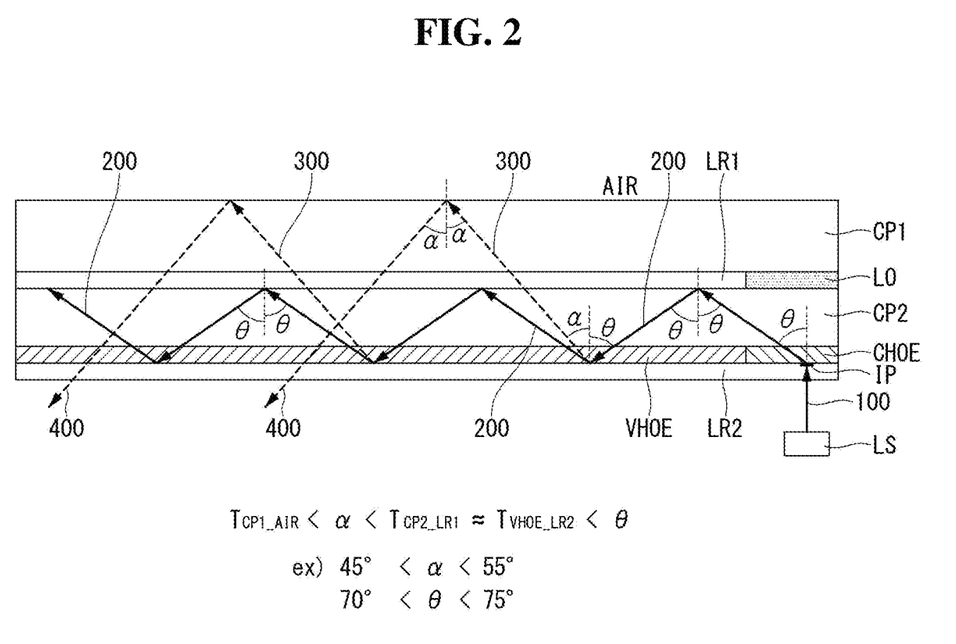
FIG. 2 is a cross-sectional view illustrating light paths inside the direction optical substrate according to the FIG. 1.

Hereinafter, referring to FIGS. 1A, 1B and 2, an aspect of the present disclosure will be described. FIGS. 1A and 1B are drawings illustrating a structure of a directional optical substrate applied for a flat panel display embedding an optical image sensor according to an aspect of the present disclosure. FIG. 1A is a side view on the XZ plane and FIG. 1B is a plan view on the XY plane.

Referring to FIGS. 1A and 1B, a directional optical unit according to an aspect includes a directional optical substrate SLS and a light source LS. The directional optical unit is an optical device for providing the collimated light expanded covering a large area corresponding to a surface of the display. Therefore, the light source LS may provide collimated light.

The directional optical substrate SLS includes a first cover plate CP1, a second cover plate CP2, a deco layer LO, a light radiating film VHOE, a light incident film CHOE, a first low refractive layer LR1 and a second low refractive layer LR2. The first cover plate CP1 and the second cover plate CP2 may have a rectangular plate shape having a length, a width and a thickness. In FIGS. 1A and 1B, the length is along to X-axis, the width is along to Y-axis and the thickness is along Z-axis. The lengths of the first cover plate CP1 and the second cover plate CP2 are disposed along X-axis, the widths of the first and the second cover plate CP1 and CP2 are disposed along Y-axis, and the thickness of them are disposed along Z-axis.

The first cover plate CP1 and the second cover plate CP2 are joined face to face. At one side and/or at the opposite side of the bottom surface of the first cover plate CP1, a decoration layer (or, deco layer) LO may be disposed. The deco layer LO is the decoration means or element for representing a logo, a trade mark or an advertising copy of the product or the manufacturer. The deco layer LO may be disposed at the non-display area including the upper side, the lower side, the left side or the right side of the display area. Under the first cover plate CP1 having the deco layer LO, the first low refractive layer LR1 is disposed. In FIG. 1A, two deco layers LO are disposed at upper side and lower side, respectively and the first low refractive layer LR1 is disposed between these two deco layers LO. However, it is not restricted to FIG. 1A. The first low refractive layer LR1 may be disposed as covering all deco layers LO.

The deco layer LO may include a transparent or an opaque film on which letters or diagrams are printed or etched. Otherwise, the deco layer LO may be a layer directly coated on the bottom surface of the first cover plate CP1 as representing letters or diagrams. In some cases, the deco layer LO may be a pattern formed on a film or on the bottom surface of the first cover plate CP1 directly.

The second cover plate CP2 is attached on the first cover plate CP1 with the first low refractive layer LR1 therebetween. Between the first cover plate CP1 and the second cover plate CP2, the deco layer LO and the first low refractive layer LR1 are inserted. When the deco layer LO is disposed on the outside surface of the first cover plate CP1 or the second cover plate CP2, it may be easily damaged or may be interfered with any other elements, because the deco layer LO has a thickness. However, in the aspect of the present disclosure, the deco layer LO is inserted between the first cover plate CP1 and the second cover plate CP2 so that it is not disturbed at the position where other elements are arranged.

On the bottom surface of the second cover plate CP2, the light radiating film VHOE and the light incident film CHOE are attached. The light radiating film VHOE is an optical element for providing the radiating lights 300. The light radiating film VHOE may be disposed as corresponding to the area for detecting and/or sensing the image.

The light incident film CHOE is an optical element for converting the collimated light provided from the light source into the lights expanded over the area of the first cover plate CP1 and the second cover plate CP2. The light incident film CHOE is disposed at outside of the light radiating film VHOE. Specifically, the light incident film CHOE is disposed as facing with the light source LS.

The light radiating film VHOE and the light incident film CHOE may be disposed on the same plane level. Considering the manufacturing process, it is further preferable that the light radiating film VHOE and the light incident film CHOE are formed as being separated each other, on a same film. The light radiating film VHOE and the light incident film CHOE may be the optical elements having the holographic patterns. In this case, after disposing the master film for the light radiating film VHOE and the master film for the light incident film CHOE close each other, these two holographic patterns may be copied on one holographic recording film, at the same time.

Under the bottom surface of the light radiating film VHOE and the light incident film CHOE, a second low refractive layer LR2 is disposed. The first low refractive layer LR1 and the second low refractive layer LR2 have the same refractive index. Further, the first low refractive layer LR1 and the second low refractive layer LR2 may have the refractive index lower than that of the first cover plate CP1, the second cover plate CP2 and the light radiating film VHOE.

For example, the first cover plate CP1 and the second cover plate CP2 may be formed of a transparent reinforced glass of which refractive index is 1.5. The light radiating film VHOE and the light incident film CHOE may be the transparent holographic recording film and may have the refractive index same with or slightly larger than that of the first and the second cover plates CP1 and CP2. Here, we use the case that the refractive index of the light radiating film VHOE and the light incident film CHOE are same with that of the first and the second cover plates CP1 and CP2. The refractive index of the first low refractive layer LR1 and the second low refractive layer LR2 may be similar to or slightly larger than the refractive index of the scanning objects. For example, when applying to the fingerprint sensor, the first and the second low refractive layers LR1 and LR2 may have the refractive index of 1.4 similar with the refractive index of human skin, 1.39.

Then, the second cover plate CP2 and the light radiating film VHOE having the refractive index of 1.5 are inserted between the first low refractive layer LR1 and the second low refractive layer LR2 having the refractive index of 1.4. As the results, two low refractive layers are attached at the upper surface and the lower surface of the high refractive layer. This satisfies the total reflection condition in which the light can propagate inside of the high refractive layer. That is, the second cover plate CP2 and the light radiating film VHOE would be the light guiding space in which the lights used for the image sensing are expanded over the whole surface of the display panel.

At the space under the light incident film CHOE, the light source LS is disposed as facing with the light incident film CHOE. The light source LS may provide a highly collimated light such as the LASER beams. Specifically, when applying to the system in which the fingerprint sensor is embedded into a portable display, the light source LS may provide the infrared laser beam which cannot be recognized by the human eyes.

The collimated light from the light source LS, as an incident light 100, having a predetermined cross sectional area is provided to a light incident point IP defined on the light incident film CHOE. The incident light 100 may enter onto the normal direction with respect to the surface of the incident point IP. However, it is not restricted, in other case, the incident light 100 may enter onto the incident point IP with an inclined angle with respect to the normal direction.

The light incident film CHOE converts the incident light 100 into a propagating light 200 having an incident angle and sends it into the second cover plate CP2. Here, the incident angle may be larger than the internal total reflection critical angle of the second cover plate CP2. As the results, as repeating the total reflection, the propagating light 200 is propagating inside of the second cover plate CP2 along to the X-axis, the length direction of the second cover plate CP2.

The light radiating film VHOE converts some amount of the propagating light 200 into the radiating light 300 and refracts the radiating light 300 to upper surface of the first cover plate CP1. Others of the propagating light 200 would continuously be propagating inside of the second cover plate CP2. At the upper surface of the first cover plate CP1, the radiating light 300 is reflected into the first cover plate CP1, passes through the first low refractive layer LR1 and then enters into the second cover plate CP2.

The radiating light 300 is totally reflected at the upper surface of the first cover plate CP1. Because the upper surface of the first cover plate CP1 is contact with the air of which refractive index is 1.0. However, at the lower surface of the first cover plate CP1, the radiating light 300 passes through the first low refractive layer LR1 and then enters into the second cover plate CP2. Further, the radiating light 300 would transmit the second low refractive layer LR2 disposed at the bottom surface of the second cover plate CP2 so that the radiating light 300 goes out of the directional optical substrate SLS. In other words, the radiating light 300 totally reflected at the upper surface of the first cover plate CP1 would be a sensing light 400 as passing through the bottom surface of the second cover plate CP2.

As the propagating light 200 goes from one side where the light incident film CHOE is disposed to the opposite side, a predetermined portion of the propagating light 200 is extracted as the radiating lights 300 by the light radiating film VHOE. The amount (or 'brightness' or 'luminance') of the radiating light 300 is decided by the light extraction efficiency of the light radiating film VHOE. For example, when the light extraction efficiency of the light radiating film VHOE is 3%, the 3% of the initial light amount of the propagating light 200 would be extracted at the first radiating point where the propagating light 200 firstly hits to the light radiating film VHOE. Then, the 97% of the propagating light 200 would be totally reflected at the first radiating point and goes on continuously. After that, at the second radiating point, 3% of the 97%, i.e., 2.91% of the initial amount of the propagating light 200 would be extracted as the radiating light 300.

Repeating this operation, a plurality of radiating lights 300 would be extracted from the first side where the light incident film CHOE is disposed to the opposite side of the first and the second cover plate CP1 and CP2. When the light radiating film VHOE has the light extraction efficiency same over all areas, the amount of the propagating light 200 is gradually lowered as propagating from the first side to opposite side. In order to get an evenly distributed amount of the lights over the whole area of the light radiating area, the light extraction efficiency of the light radiating film VHOE may be exponentially increased from the first side to the opposite side.

As observing the propagating light 200 on the XZ plane (or, 'vertical plane') having the length axis and the thickness axis, the collimated condition of the incident light 100 is maintained. On the contrary, on the XY plane (or, 'horizontal plane') having the length axis and the width axis, the propagating light 200 may be an diverged (or, expanded) light having an expanding angle, $\phi$. The reason of expanding the propagating light 200 is that the image sensing area is set as covering most area of the first and the second cover plate CP1 and CP2. For example, the light radiating film VHOE may have an area corresponding to the whole area of the light going-out part LOT. Further, the expanding angle $\phi$ may be an inside angle between two lines, one line is connecting the incident point IP and one end point P1 of the opposite side of the cover plate CP and the other line is connecting the incident point IP and other end point P2 of the opposite side of the cover plate CP.

The area where the light incident film CHOE is disposed would be defined as a light entering part LIN. The area where the light radiating film VHOE is disposed would be defined as a light going-out part LOT. The light going-out part LOT would be the light propagating part where the light is going through. In FIG. 1, the light incident film CHOE covers the whole area of the light entering part LIN, in convenience. Otherwise, it is enough that the light incident film CHOE has a size slightly larger than the size of the light incident point IP.

For example, the cross sectional size of the collimated light generated from the light source LS may have the right circle shape of which radius is 0.5 mm. The light incident film CHOE would have the length corresponding to the width of the first and the second cover plates CP1 and CP2 and the width of 3 mm~5 mm. The light incident film CHOE may be disposed as crossing the width of the first and the second cover plates CP1 and CP2.

Hereinafter, referring to FIG. 2, we will explain how the collimated infrared light provided from the light source is converted into a directional infrared light used for image sensing inside of the directional optical substrate SLS. FIG. 2 is a cross sectional view illustrating light paths inside of the directional optical substrate according to the FIG. 1.

The incident light 100 provided from the light source LS enters onto the normal direction with respect to the surface of the incident point IP of the light incident film CHOE. The light incident film CHOE converts the incident light 100 into a propagating light 200 refracted as having an incident angle θ to the normal direction with respect to the surface of the incident point IP. And then, the light incident film CHOE provides the propagating light 200 to the inside space (or 'the media') of the second cover plate CP2.

The incident angle θ of the propagating light 200 may be larger than the total reflection critical angle $T_{VHOE\_LR2}$ at the interface between the light radiating film VHOE and the second low refractive layer LR2. Further, it is preferable that the incident angle θ of the propagating light 200 is larger than the total reflection critical angle TCP2_LR1 at the interface between the second cover plate CP2 and the first low refractive layer LR1.

For example, when the refraction index of the second cover plate CP2 and the light radiating film VHOE is 1.5, and the refraction index of the first low refractive layer LR1 and the second low refractive layer LR2 are 1.4, the total reflection critical angle $T_{VHOE\_LR2}$ at the interface between the light radiating film VHOE and the second low refractive layer LR2 and the total reflection critical angle $T_{CP2\_LR1}$ at the interface between the second cover plate CP2 and the first low refractive layer LR1 may be greater than 69° (degree). Therefore, the incident angel θ may be larger than 69°. For example, the incident angle θ may be any one of 70° to 75°.

The light radiating film VHOE converts a predetermined amount of the propagating light 200 into a radiating light 300 having a reflection angle α and sends the radiating light 300 back into the inside space of the first cover plate CP1. The radiating light 300 is for detecting an image of an object when the object is contacting on the upper surface of the first cover plate CP1. When there is no object on the outer surface of the first cover plate CP1, the radiating light 300 is totally reflected at the upper surface of the first cover plate CP1 and then is provided to the photo sensor (or, optical sensor) disposed at the outside of the bottom surface of the directional optical substrate SLS. That is, after totally reflected at the upper surface of the first cover plate CP1, the radiating light 300 goes out of the directional optical substrate SLS, as the sensing light 400.

The sensing light 400 is the light reflected by the upper surface of the first cover plate CP1 with an incident angle (or, reflecting angle) of α. The reflecting angle α of the sensing light 400 is smaller than the incident angle θ of the propagating light 300. Therefore, the sensing light 400 passes through the first cover plate CP1, the first low refractive layer LR1, the second cover plate CP2, the light radiating film VHOE and the second low refractive layer LR2 sequentially, and then goes out of the directional optical substrate SLS.

Detecting the sensing light 400 radiated out of the second low refractive layer LR2 disposed under the bottom surface of the directional optical substrate SLS, the images of the object contacted on the upper surface of the first cover plate CP1 would be recognized. Hereinafter, we will explain about the image sensing device applying the directional optical unit as shown in FIG. 1. Specifically, we focus on a flat panel display embedding a fingerprint recognizing sensor.

Figure 3A:
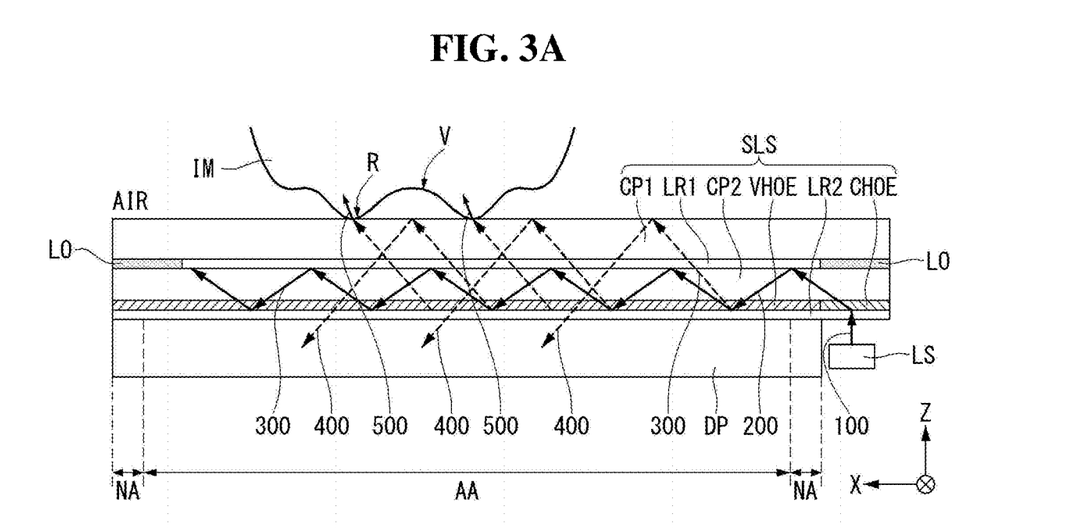
FIGS. 3A and 3B illustrate a structure of a flat panel display embedding an optical image sensor including a directional optical unit and an optical sensor, according to an aspect of the present disclosure.
Figure 3B:
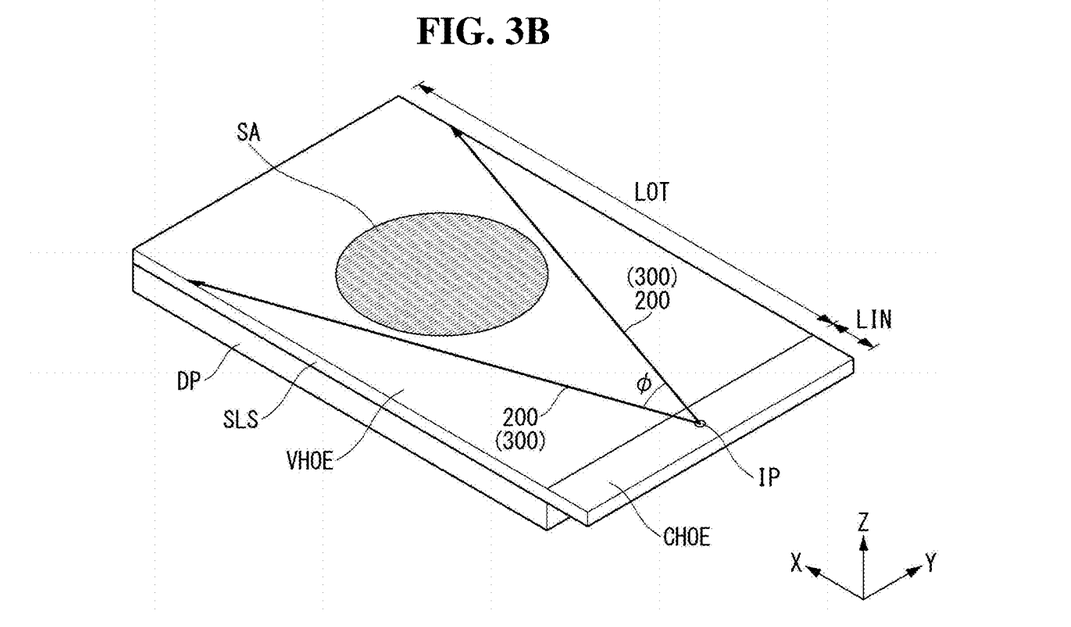

FIGS. 3A and 3B illustrate a structure of a flat panel display embedding an optical image sensor including a directional optical unit and an optical sensor, according to an aspect of the present disclosure. Referring to FIG. 3A, a flat panel display embedding an optical image sensor according to an aspect of the present disclosure comprises a display panel DP, a directional optical substrate SLS and a light source LS. The display panel DP includes a display area AA and a non-display area NA. The display area AA may be disposed at the middle portions of the display panel DP. The non-display area NA may be surrounding the display area AA. The display area AA may have a plurality of the display elements for representing the video images shown on the display panel DP. The non-display area may have a plurality of the driving elements for operating the display elements arrayed in the display area AA.

In detail, a plurality of pixel area for representing the video images may be arrayed in a matrix manner in the display area AA. At least one of the pixel areas, one photo sensor may be included for detecting the image of the object. In some cases, one photo sensor may be disposed at one group of the pixel areas. For example, one photo sensor would be disposed at every pixel group including 2×2, 3×3 or 4×4 pixels.

The directional optical substrate SLS may be a thin plate having a predetermined length, width and thickness. The length and width of the directional optical substrate SLS may have an enough size corresponding to the size of the display panel DP. Specifically, the directional optical substrate SLS may have the size slightly larger than that of the display panel DP. At least, the directional optical substrate SLS may have the extended (or expanded) area over one side of the display panel DP. At the extended side area over the display panel DP, the light source LS may be disposed.

The directional optical substrate SLS may be joined with the display panel DP as it is attached on the upper surface of the display panel DP. The directional optical substrate SLS includes a first cover plate CP1, a second cover plate CP2, a deco layer LO, a light radiating film VHOE, a light incident film CHOE, a first low refractive layer LR1 and a second low refractive layer LR2, as mentioned above. The first low refractive layer LR1 is inserted between the first cover plate CP1 and the second cover plate CP2 for attaching the first cover plate CP1 and the second cover plate CP2 in face to face.

The second low refractive layer LR2 may be inserted between the second cover plate CP2 and the display panel DP for attaching the directional optical substrate SLS with the display panel DP. Here, the upper surface of the display panel DP is the front face providing the video images from the display panel DP. That is, the user observes the video image as seeing the upper surface of the display panel DP.

The directional optical substrate SLS, as mentioned above, may provide the image sensing light 400 to the bottom surface facing with the upper surface of the display panel DP. Therefore, the photo sensor disposed in the display panel DP located under the directional optical substrate SLS may detect the sensing light 400. As the results, the images of the object (for example, the ridge pattern of the fingerprint) contacting on the upper surface of the directional optical substrate SLS may be recognized.

In detail, the radiating light 300 generated by the light radiating film VHOE of the directional optical substrate SLS would reach to the upper surface of the first cover plate CP1. When an object IM is disposed on the first cover plate CP1, the radiating light 300 hits the area where the object IM is not contacting is totally reflected and provided to the display panel DP as the sensing light 400. On the contrary, the radiating light 300 hits the area where the object IM is contacting is refracted and goes out to the first cover plate CP1. At the point where the object IM having the refraction index larger than that of air is contacting, the radiating light 300 is not totally reflected but it is refracted into the object IM. That is, at the area where the object IM is contacting, the radiating light 300 would be an absorbed light 500 so that it is not provided to the photo sensor of the display panel DP.

As the results, the photo sensor of the display panel DP detects only the sensing lights 400 except the absorbed lights 500 among the radiating lights 300. Detecting the reflection patterns of the sensing lights 400 reflected at the top surface of the first cover plate CP1, the photo sensors of the display panel DP reproduces the patterns or images of the object IM.

When applying the directional optical unit to the fingerprint sensor, the object IM would be the finger of the human. The ridge R of the fingerprint is contacting on the top surface of the first cover plate CP1 but the valley V of the fingerprint is not contacting with the top surface of the first cover plate CP1. The radiating lights 300 hit the valley V are totally reflected to be the sensing lights 400. In the interim, the radiating lights 300 hit the ridge R are refracted so that they would be the absorbed lights 500 going out of the first cover plate CP1.

Further referring to FIG. 3B, we will explain about the process of the image sensing on the XY plane. The incident light 100 may include a collimated infrared light having a predetermined cross sectional area. The light source LS may be an infrared LASER diode (or 'IR LD').

The incident light 100 would be converted to a propagating light 200 by the light incident film CHOE. Here, the propagating light 200 would be expanded as having an expanding angle ϕ on the XY plane including the length axis on the X axis and the width axis on the Y axis. In the interim, on the XZ plane including the length axis on the X axis and the thickness axis on the Z axis, the initial collimated condition would be maintained.

Here, the expanding angle ϕ may be equal to or slightly larger than the inside angle of two lines connecting from the light incident point IP to the two end points of the first and the second cover plate CP1 and CP2 opposing the light incident film CHOE, respectively. In this case, the propagating light 200 may be expanded as having a triangular shape having the expanding angle ϕ. As the results, the radiating lights 300 may covers the same area covered as the propagating light 200 is expanded. That is, the image sensing area would be defined inside of the triangular shape. When applying with the fingerprint sensor, the fingerprint sensing area SA may be defined as the circle area hatched in FIG. 3A.

When setting the sensing area SA on the center portion or on upside-shifted portion away from the light incident film CHOE, the amount (or luminance or brightness) of the radiating lights 300 may have the maximum value in the sensing area SA. To do so, the light radiating film VHOE may be designed as having varying light extraction efficiency according to the functional relationship with the position, such that the amount of the radiating lights 300 may have the maximum value at the area corresponding to the sensing area SA and have the minimum value or the zero at the other areas.

<First Aspect>

Until now, we explain about the features of the present disclosure based on the directional optical unit for providing the directional lights in the flat panel display embedding an optical image sensor. Hereinafter, we will explain about the application aspect for the whole structure of the flat panel display embedding an optical image sensor formed by joining the flat display panel with a directional optical unit according to the present disclosure.

Figure 4:
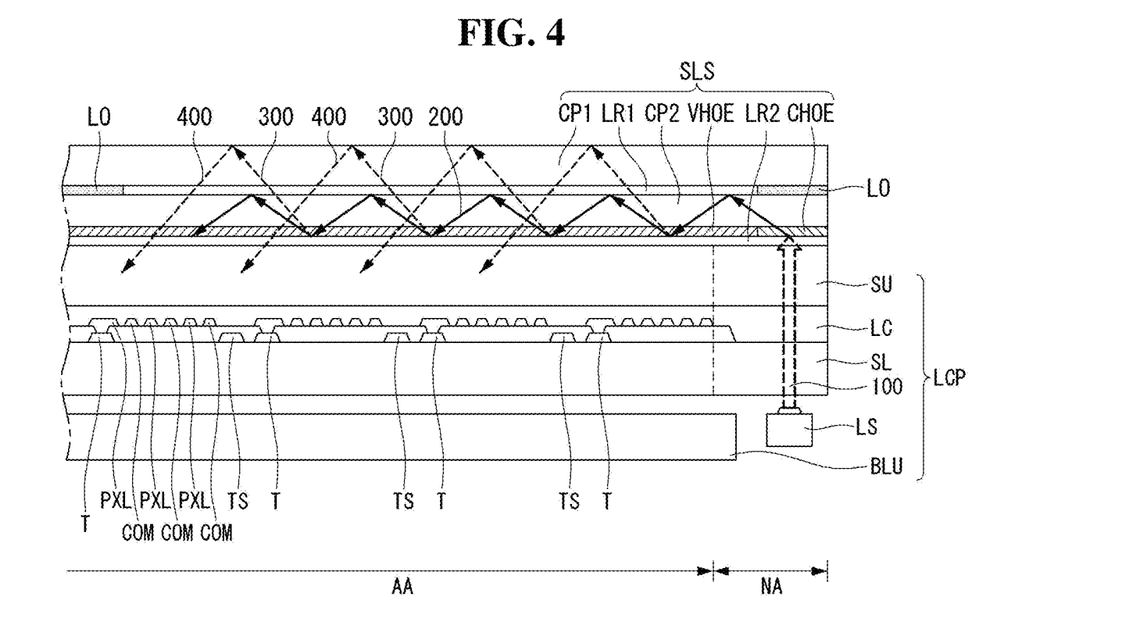
FIG. 4 is a cross-sectional view illustrating a structure of a liquid crystal display embedding an optical image sensor including a directional optical unit and an optical sensor according to a first aspect of the present disclosure.

Referring to FIG. 4, we will explain about a flat panel display embedding an optical image sensor according to the first application example. FIG. 4 is a cross sectional view illustrating a structure of a liquid crystal display embedding an optical image sensor including a directional optical unit and an optical sensor according to the first application example.

The liquid crystal display embedding an optical image sensor according to the first application example comprises a liquid crystal display panel LCP, a directional optical substrate SLS and a light source LS. The liquid crystal display panel LCP includes a lower substrate SL and an upper substrate SU joining each other and a liquid crystal layer LC disposed between two substrates SL and SU. On the lower substrate SL, a plurality of the pixel areas are disposed in a matrix manner. At the upper substrate SU, a plurality of color filters is disposed as each color filter is corresponding to each pixel area. Otherwise, the upper substrate SU may have any important elements. Here, the liquid crystal display panel LCP shown in figure is one of a horizontal electric field type. However, it is not restricted this type of liquid crystal display panel, but various type liquid crystal display panels may be used.

Within each pixel area, the pixel electrode PXL and the common electrode COM are disposed for representing video images. Further, the thin film transistor T would be disposed for selectively supplying the video signal to the pixel electrode PXL. The photo sensor TS may be disposed near the thin film transistor T. At least one photo sensor TS may be disposed at each of the pixel area. Otherwise, one photo sensor TS may be disposed at set of the pixel areas.

On the top surface of the upper substrate SU of the liquid crystal display panel LCP, the directional optical substrate SLS according to the aspects of the present disclosure is attached in a face-to-face manner. The directional optical substrate SLS includes a first cover plate CP1, a second cover plate CP2, a deco layer LO, a light radiating film VHOE, a light incident film CHOE, a first low refractive layer LR1 and a second low refractive layer LR2. The second low refractive layer LR2 of the directional optical substrate SLS is attached with the top surface of the upper substrate SU.

The liquid crystal display panel LCP is one of the non-self-emission display panels which cannot radiate the light. Therefore, a back light unit BLU may be required under the bottom surface of the low substrate SL. At one lateral side, the light source LS may be disposed as facing with the light incident film CHOE. The light source LS may be configured with the back light unit BLU as the one-body system. Otherwise, the light source LS may be disposed near the back light unit BLU as being apart from the back light unit BLU.

The liquid crystal display panel LCP includes a display area AA and a non-display area NA. The light radiating film VHOE of the directional optical substrate SLS may be disposed as corresponding to the display area AA. The light source LS may be disposed in the non-display area NA as facing with the light incident film CHOE. The deco layer LO may be disposed as corresponding to the non-display area NA.

<Second Aspect>

Figure 5:
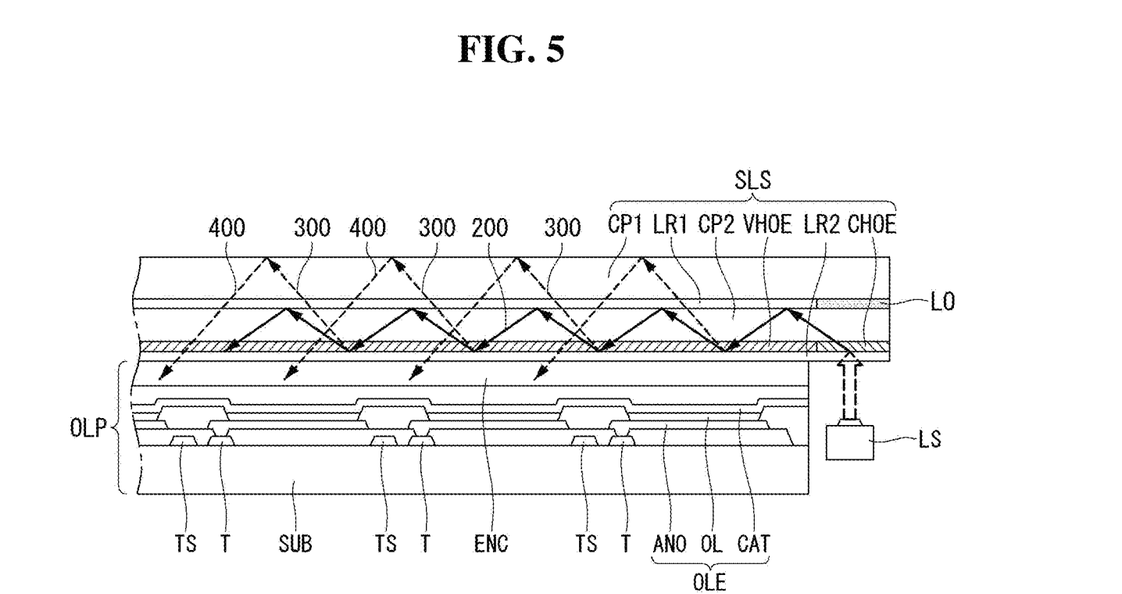
FIG. 5 is a cross-sectional view illustrating a structure of an organic light emitting diode display embedding an optical image sensor including a directional optical unit and an optical sensor according to a second aspect of the present disclosure.

Referring to FIG. 5, we will explain about a flat panel display embedding an optical image sensor according to the second application example. FIG. 5 is a cross sectional view illustrating a structure of an organic light emitting diode display embedding an optical image sensor including a directional optical unit and an optical sensor according to the second application example.

The organic light emitting diode display embedding an optical image sensor according to the second application example comprises an organic light emitting diode display panel OLP, a directional optical substrate SLS and a light source LS. The organic light emitting diode display panel OLP includes a substrate SUB having the display elements and an en-cap ENC, as attaching each other in a face-to-face manner. On the substrate SUB, a plurality of pixel areas is disposed in a matrix manner. At the en-cap ENC, a plurality of color filters may be disposed as each color filter is corresponding to each pixel area. Otherwise, the en-cap ENC may be a transparent substrate without any specific elements. Here, the organic light emitting diode display panel OLP shown in figure is one of top emission type. However, it is not restricted the top emission type, but various type including bottom emission type or both side emission type may be used.

Within each pixel area, the organic light emitting diode OLE for representing the video image and the thin film transistor T for selectively supplying the video data to the organic light emitting diode OLE are disposed. The organic light emitting diode OLE includes an anode electrode ANO, an organic light emitting layer OL and a cathode electrode CAT. The photo sensor TS may be disposed near the thin film transistor T. At least one photo sensor TS may be disposed at each of the pixel area. Otherwise, one photo sensor TS may be disposed at set of the pixel areas.

On the top surface of the en-cap ENC of the organic light emitting diode display panel OLP, the directional optical substrate SLS according to the aspects of the present disclosure is attached in a face-to-face manner. The directional optical substrate SLS includes a first cover plate CP1, a second cover plate CP2, a deco layer LO, a light radiating film VHOE, a light incident film CHOE, a first low refractive layer LR1 and a second low refractive layer LR2. The second low refractive layer LR2 of the directional optical substrate SLS is attached with the top surface of the en-cap ENC.

The organic light emitting diode display panel OLP is one of the self-emission display panel which can radiate the light. Therefore, it does not require the back light unit BLU. Therefore, the light source LS may be disposed at one lateral side of the organic light emitting diode display panel OLP as facing with the light incident film CHOE.

In detail, the organic light emitting diode display panel OLP includes a display area AA and a non-display area NA. The directional optical substrate SLS may have slightly larger size than the organic light emitting diode display panel OLP. The light radiating film VHOE of the directional optical substrate SLS may be disposed as corresponding to the display area AA. The light incident film CHOE may be disposed as covering an exterior space extended from one lateral side of the organic light emitting diode display panel OLP. The light source LS may be disposed under the exterior space as facing with the light incident film CHOE. The deco layer LO may be disposed within the non-display area NA.

As mentioned above, the display embedding an optical image sensor includes a cover plate disposed at the outermost surface and an ultra-thin film type holographic film having at most some hundreds μm of thickness and attached at one side of the cover plate. Therefore, the optical image sensor according to the present disclosure can be configured with the display panel in which the total thickness is not too being thicker. Further, evenly distributing the highly collimated sensing lights over the most surface of the display panel, the ultra-high resolution for image sensing would be acquired. Therefore, it is very efficient to detect tiny image pattern such as fingerprint or palm print one the large area, exactly.

The display embedding an optical image sensor according to the present disclosure has a feature in which the cover glass is used as a means that provides the lights for sensing the image of the object. Specifically, using thinner two attached cover glasses of which thickness is reduced in half, and inserting the holographic elements and the deco layer between the two cover glasses, these elements can be disposed without any interferences from each other. As each of two cover glasses has the thickness reduced in half, the display panel embedding the image sensor can be acquired without increasing of the total thickness and/or weight of the display.

<Third Aspect>

Figure 6:
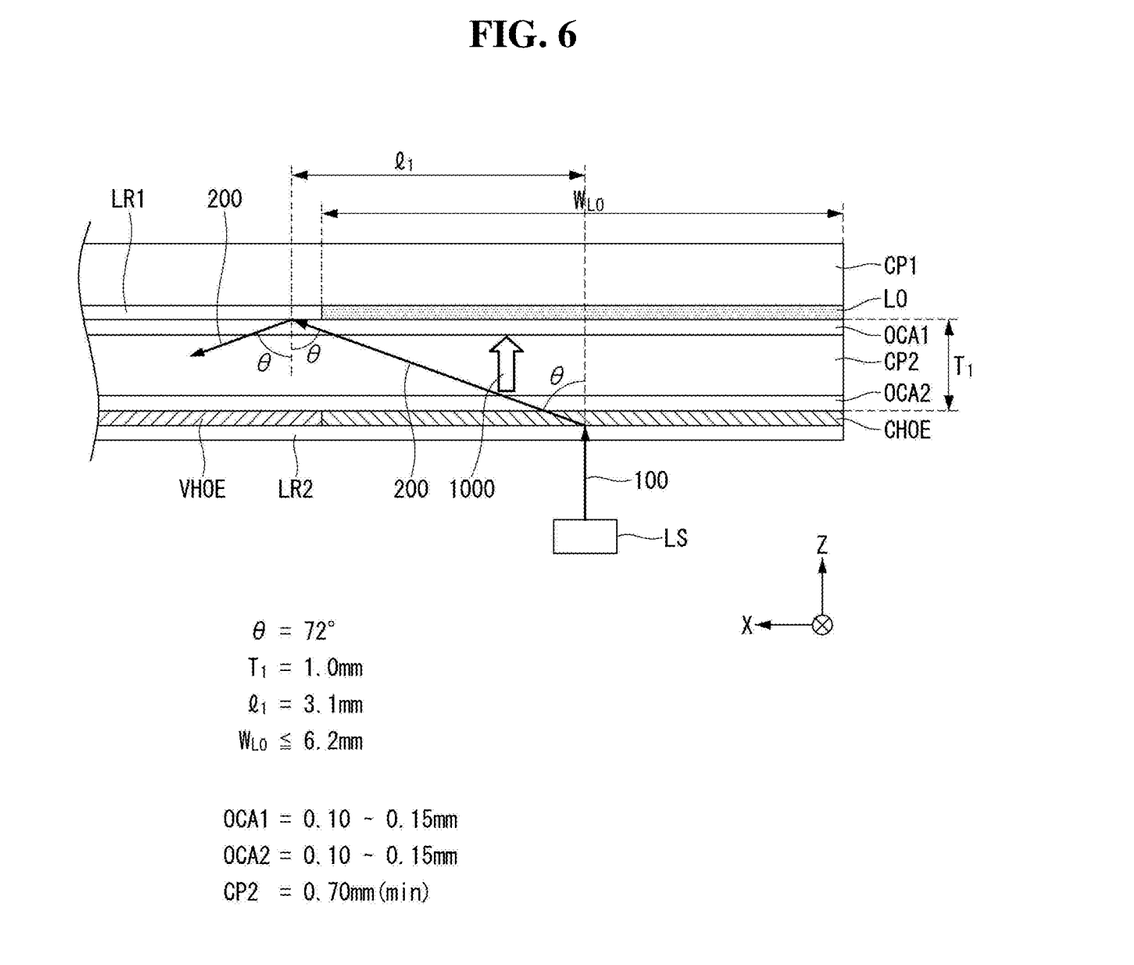
FIG. 6 is a cross-sectional view illustrating a structure of a directional optical unit according to a third aspect of the present disclosure.

Hereinafter, referring to FIG. 6, we will explain about the structure of a directional optical unit according to the third application example of present disclosure, more detail. FIG. 6 is a cross sectional view illustrating a structure of a directional optical unit according to the third application example of the present disclosure. The directional optical unit according to the third application example may be applied to the liquid crystal display and/or the organic light emitting diode display mentioned in the first application example and the second application example.

The directional optical unit according to the third application example has a similar structure shown in FIG. 1, basically. The main features of the third application example are that the detail stacking structure and the thickness relationships. Hereinafter, the descriptions having no extra meanings will not be duplicated.

Referring to FIG. 6, the directional optical unit according to the third application example comprises a directional optical substrate SLS and a light source LS. The directional optical substrate SLS includes a first cover plate CP1, a second cover plate CP2, a deco layer LO, a light radiating film VHOE, a light incident film CHOE, a first low refractive layer LR1 and a second low refractive layer LR2.

The first cover plate CP1 and the second cover plate CP2 are joined face to face. At one side and/or at the opposite side of the bottom surface of the first cover plate CP1, a decoration layer (or, deco layer) LO may be disposed. The deco layer LO is the decoration means or element for representing a logo, a trade mark or an advertising copy of the product or the manufacturer. Under the first cover plate CP1 having the deco layer LO, the first low refractive layer LR1 is disposed. In FIG. 6, the deco layer LO and the first low refractive layer LR1 are disposed on the same layer. The first low refractive layer LR1 may be disposed as covering the deco layers LO.

The deco layer LO may include a transparent or an opaque film on which letters or diagrams are printed or etched. Otherwise, the deco layer LO may be a layer directly coated on the bottom surface of the first cover plate CP1 as representing letters or diagrams. In some cases, the deco layer LO may be a pattern formed on a film or on the bottom surface of the first cover plate CP1 directly.

The second cover plate CP2 is attached on the first cover plate CP1 with the first low refractive layer LR1 therebetween. Between the first cover plate CP1 and the second cover plate CP2, the deco layer LO and the first low refractive layer LR1 are inserted. Here, the first cover plate CP1 and the second cover plate CP2 may be attached in a face-to-face manner each other with a first optical adhesive OCA1. For example, the first optical adhesive OCA1 is coated on the whole bottom surface of the deco layer LO and the first low refractive layer LR1. The second cover plate CP2 is attached to the first optical adhesive OCA1.

On the bottom surface of the second cover plate CP2, the light radiating film VHOE and the light incident film CHOE are attached. The light radiating film VHOE and the light incident film CHOE are disposed on the same layer. The light radiating film VHOE and the light incident film CHOE may be attached to the second cover plate CP2 by a second optical adhesive OCA2 in a face-to-face manner. The light radiating film VHOE may be disposed as corresponding to the area for detecting and/or sensing the image.

Under the bottom surface of the light radiating film VHOE and the light incident film CHOE, a second low refractive layer LR2 is disposed. The first low refractive layer LR1 and the second low refractive layer LR2 may have the same refractive index. Further, the first low refractive layer LR1 and the second low refractive layer LR2 may have the refractive index lower than that of the first cover plate CP1, the second cover plate CP2 and the light radiating film VHOE.

The light source LS provides the incident light 100 to the light incident film CHOE. The light source LS may be disposed as the incident light 100 hits on the center of the light incident film CHOE. The light incident film CHOE converts the incident light 100 into a propagating light 200 and sends it into the second cover plate CP2. Here, the propagating light 200 may have an incident angle (or reflecting angle) θ of which range may be 70° to 75° as propagating into the second cover plate CP2. In the third application example, the propagating light 200 may have the incident angle of 72°.

Under these conditions, the position where the propagating light 200 hits the first low refractive layer LR1 at first is decided by the incident angle θ and a first thickness T1. Here, the first thickness T1 is corresponding to the distance between the light incident film CHOE and the deco layer LO or to the distance between the light incident film CHOE and the first low refractive layer LR1.

For example, considering the manufacturing process, the light incident film CHOE may have a width of 5 mm. In that case, the deco layer LO may have the similar size with the light incident film CHOE. That is, the deco layer LO may have a width of 5 mm.

Further, with the above conditions, the first thickness T1 may be 1.0 mm. Considering the incident angle of 72°, the first length $l_1$ from the center point of the light incident film CHOE to the first hit point of the propagating light 200 to the first low refraction layer LR1 would be 3.1 mm. Therefore, it is preferable that the deco layer LO has a width WLO less than 6.2 mm.

More detail, the thicknesses of the first optical adhesive OCA1 and the second optical adhesive OCA2 are selected one of 0.10~0.15 mm. Therefore, the thickness of the second cover plate CP2 may be 0.70 mm (700 μm) at least.

Ensuring that the thickness of the second cover plate CP2 is 0.70 mm at least, the first thickness T1 may be 1.0 mm at least. These values are not just designing variation. The present disclosure has a feature in which the lights from the light source LS is changed into the propagating light 200 satisfying the internal total reflection conditions within the second cover plate CP2 using the light incident film CHOE one of holographic elements.

That is, the propagating light 200 which is diffracted from the incident light 100 by the light incident film CHOE is the first diffraction light. Therefore, the 0th diffraction light 1000 which is not diffracted from the incident light 100 by the light incident film CHOE would be provided. When the 0th diffraction light 1000 is directly radiated out, it give any unexpected hindrance to the user. Therefore, the 0th diffraction light 1000 may be blocked by the deco layer LO. In order to increase the blocking property to the 0th diffraction light 1000, the deco layer LO may have a black background on which the decoration pattern is printed.

However, when the second cover plate CP2 does not have enough thickness, the deco layer LO cannot block the 0th diffraction light 1000 perfectly, even though the deco layer LO includes a black light absorbing material. Hereinafter, referring to FIG. 7 illustrating a comparison example, the reason will be explained.

<Comparison Example>

Figure 7:
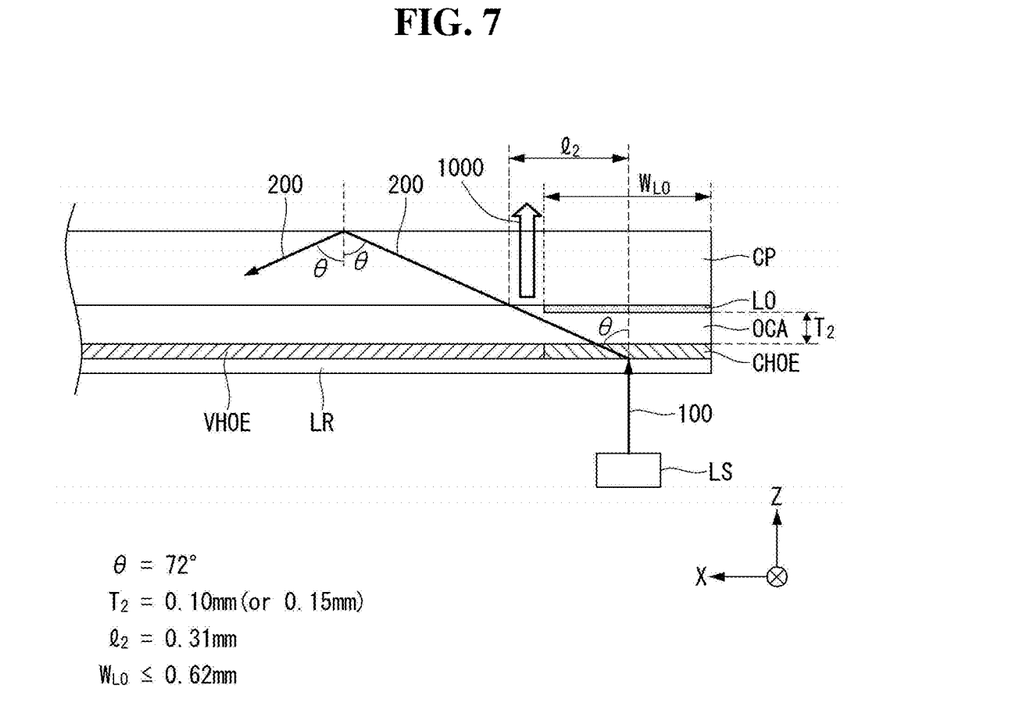
FIG. 7 is a cross-sectional view illustrating a comparison example with the third aspect of the present disclosure.

FIG. 7 is a cross sectional view illustrating a comparison example with the third aspect of the present disclosure. The directional optical unit according to the comparison example has a structure in which single cover plate CP is included only. Referring to FIG. 7, the directional optical unit according to the comparison example includes a directional optical substrate SLS and a light source LS.

The directional optical substrate SLS includes one cover plate CP, a deco layer LO, an optical adhesive OCA, a light radiating film VHOE, a light incident film CHOE and a low refractive layer LR. At one side of the bottom surface of the cover plate CP, the deco layer LO is disposed. Under the bottom surface of the cover plate CP having the deco layer LO, the light radiating film VHOE and the light incident film CHOE are disposed. Here, between the bottom surface of the cover plate CP having the deco layer LO and the light radiating film VHOE (and the light incident film CHOE), the optical adhesive OCA is inserted. Under the light radiating film VHOE and the light incident film CHOE, the low refractive layer LR is disposed.

The incident light 100 provided from the light source LS hits on the center of the light incident film CHOE. The incident light 100 is converted into a propagating light 200. The propagating light 200 enters into the cover plate CP. Here, the propagating light 200 has an incident angle of 72°.

The optical adhesive OCA has a thickness 0.10~0.15 mm, corresponding to the second thickness T2. Here, the second thickness T2 is corresponding to the distance between the light incident film CHOE and the deco layer LO. Under this condition, considering the incident angle of 72°, the second length $l_2$ from the center point of the light incident film CHOE to the first hit point of the propagating light 200 to the bottom surface of the cover plate CP would be 0.31 mm. Therefore, the deco layer LO has a width WLO less than 0.62 mm.

When the incident light 100 provided from the light source LS has a diameter of 0.5 mm, the deco layer LO would have a larger size than the diameter of the incident light 100. In that case, the 0th diffraction light 1000 is not be blocked perfectly, but some of the 0th diffraction light 1000 may be leaked out at the side edge of the deco layer LO. If enlarging the size of the deco layer LO to perfectly block the 0th diffraction light 1000, the propagating light 200 which is the first diffraction light of the incident light 100 is blocked, so that the propagating light 200 does not enter into the cover plate CP. According to the comparison example, the $0^{th}$ diffraction light 1000 from the light incident film CHOE is leaked out and it may cause the bad affections to the user.

Considering the comparison example, the directional optical unit may include two cover plates and the second cover plate CP2 disposed at lower layer has the thickness of 0.70 mm at least, as explained in the third application example. Further, the distance between the light incident film CHOE and the deco layer LO may be 1.0 mm at least.

With the distance of 1.0 mm at least between the light incident film CHOE and the deco layer LO, the $0^{th}$ diffraction light 1000 is perfectly blocked as well as the deco layer LO can be freely designed without any restriction to its size. By ensuring the distance between the light incident film CHOE and the deco layer LO, the first hit position, along to X-axis, of the propagating light 200 onto the first low refractive layer LR1 have enough long distance to block the $0^{th}$ diffraction light 1000 perfectly. Therefore, the deco layer LO can have a size enough to block the $0^{th}$ diffraction light 1000 perfectly.

Here, we provide that the minimum thickness between the light incident film CHOE and the deco layer LO is 1.0 mm, in order to block the $0^{th}$ diffraction light at first. However, the thickness is not to be restricted to the 1.0 mm or more. Considering other conditions such as the wavelength of the incident light provided from the light source LS, this minimum thickness may be less than 1.0 mm. For example, when the thickness between the light incident film CHOE and the deco layer LO is 0.5 mm, the $0^{th}$ diffraction light may be blocked with modifying other conditions. However, considering the manufacturing conditions and other conditions, it is more preferable that the thickness between the light incident film CHOE and the deco layer LO is 1.0 mm.

While the aspect of the present disclosure has been described in detail with reference to the drawings, it will be understood by those skilled in the art that the disclosure can be implemented in other specific forms without changing the technical spirit or essential features of the disclosure. Therefore, it should be noted that the forgoing aspects are merely illustrative in all aspects and are not to be construed as limiting the disclosure. The scope of the disclosure is defined by the appended claims rather than the detailed description of the disclosure. All changes or modifications or their equivalents made within the meanings and scope of the claims should be construed as falling within the scope of the disclosure.

What is claimed is:

1. A directional optical unit of a display panel with an embedded image sensor, the display panel having a display area and a non-display area, comprising:
   a first cover plate and a second cover plate facing each other;
   a first low refractive layer disposed between the first and second cover plates;
   a light radiating film disposed under the second cover plate and having a length corresponding to the display area;
   a light incident film disposed under the second cover plate and outside the display area at one lateral side of the light radiating film;
   a second low refractive layer disposed under the light radiating film and the light incident film and attached on the display panel;
   a light source disposed at the lateral side of the display panel and facing the light incident film; and
   a light blocking layer blocking $0^{th}$ diffraction light, disposed under the first cover plate and on at least one side of the non-display area.

2. The directional optical unit according to the claim 1, wherein the light source provides an incident light to an incident point defined on a surface of the light incident film, wherein the light incident film includes a first holographic pattern converting the incident light to a propagating light having an incident angle satisfying an internal total reflection condition of the second cover plate, and sending the propagating light into the second cover plate; and the light radiating film includes a second holographic pattern converting some of the propagating light into the sensing light having a reflection angle which satisfies a total reflection condition at a top surface of the first cover plate and a transmitting condition through the first low refractive layer and the second low refractive layer.

3. The directional optical unit according to the claim 2, wherein the incident angle is larger than a first internal total reflection critical angle between the light radiating film and the second low refractive layer, and larger than a second internal total reflection critical angle between the second cover plate and the first low refractive layer.

4. The directional optical unit according to the claim 2, wherein the reflection angle is larger than a first total reflection critical angle between the first cover plate and an air layer, and smaller than a second total reflection critical angle between the light radiating film and the second low refractive layer.

5. The directional optical unit according to the claim 2, wherein the propagating light has an expanding angle on a horizontal plane including a length axis and a width axis, and maintains a collimated state on a vertical plane including the length axis and a thickness axis.

6. The directional optical unit according to the claim 5, wherein the expanding angle is at least equal to an inner angle between a first line and a second line, the first line is connecting the incident point and one end of an opposite side of the second cover plate facing the light incident film, and the second line is connecting the incident point and other end of the opposite side of the second cover plate.

7. The directional optical unit according to the claim 6, wherein the light incident film and the light source are disposed under the light blocking layer.

8. The directional optical unit according to the claim 6, wherein the first low refractive layer and the light blocking layer are formed of a film, a coating layer and a pattern disposed between the first cover plate and the second cover plate.

9. The directional optical unit according to the claim 6, wherein a thickness between the light blocking layer and the light incident film is at least 1.0 mm.

10. The directional optical unit according to the claim 1, wherein the second cover plate has a thickness of at least 0.70 mm.

* * * * *